(12) United States Patent
Wu et al.

(10) Patent No.: US 7,691,556 B2
(45) Date of Patent: Apr. 6, 2010

(54) ANTIREFLECTIVE COMPOSITIONS FOR PHOTORESISTS

(75) Inventors: Hengpeng Wu, Hillsborough, NJ (US); Shuji Ding-Lee, Branchburg, NJ (US); Zhong Xiang, Edison, NJ (US); Aritaka Hishida, Bedminster, NJ (US); Jianhui Shan, Pennington, NJ (US); Hong Zhuang, Raritan, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 815 days.

(21) Appl. No.: 11/159,002

(22) Filed: Jun. 22, 2005

(65) Prior Publication Data
US 2006/0058468 A1    Mar. 16, 2006

Related U.S. Application Data

(63) Continuation-in-part of application No. 10/941,221, filed on Sep. 15, 2004, now abandoned.

(51) Int. Cl.
G03F 7/00      (2006.01)
G03F 7/004     (2006.01)

(52) U.S. Cl. ............... 430/270.1; 430/271.1; 430/311; 430/330

(58) Field of Classification Search ............ 430/270.1, 430/271.1, 273.1
See application file for complete search history.

(56) References Cited

U.S. PATENT DOCUMENTS

| | | | |
|---|---|---|---|
| 3,232,692 A | 2/1966 | Wilhelm et al. | |
| 3,707,584 A | 12/1972 | Tulacs | |
| 4,064,191 A | 12/1977 | Parekh | |
| 4,229,400 A | 10/1980 | Laurie | |
| 4,254,235 A | 3/1981 | Turpin | |
| 4,255,558 A * | 3/1981 | Turpin | 528/245 |
| 4,487,889 A * | 12/1984 | Craun | 525/163 |
| 4,491,628 A | 1/1985 | Ito et al. | |
| 4,492,628 A | 1/1985 | Young et al. | |
| 5,069,997 A | 12/1991 | Schwaim et al. | |
| 5,162,510 A | 11/1992 | Potvin et al. | |
| 5,294,671 A | 3/1994 | Szita et al. | |
| 5,294,680 A | 3/1994 | Knors et al. | |
| 5,350,660 A | 9/1994 | Urano et al. | |
| 5,371,169 A | 12/1994 | Lu et al. | |
| 5,585,219 A | 12/1996 | Kaimoto et al. | |
| 5,733,714 A | 3/1998 | McCulloch et al. | |
| 5,919,599 A * | 7/1999 | Meador et al. | 430/271.1 |
| 5,935,760 A | 8/1999 | Hester et al. | |
| 5,981,145 A | 11/1999 | Ding et al. | |
| 6,165,684 A | 12/2000 | Mizutani et al. | |
| 6,187,506 B1 | 2/2001 | Ding et al. | |
| 6,465,148 B1 | 10/2002 | Kang et al. | |
| 6,653,411 B2 | 11/2003 | Puligadda et al. | |
| 6,664,363 B1 * | 12/2003 | Faunce | 528/295.5 |
| 6,689,535 B2 | 2/2004 | Iguchi | |
| 6,727,032 B1 | 4/2004 | Suwa et al. | |
| 6,737,492 B2 | 5/2004 | Kang et al. | |
| 6,894,104 B2 | 5/2005 | Xu et al. | |
| 6,927,015 B2 | 8/2005 | Khojasteh et al. | |
| 7,038,328 B2 | 5/2006 | Enomoto et al. | |
| 7,553,905 B2 | 6/2009 | Abdallah et al. | |
| 2003/0065164 A1 | 4/2003 | Puligadda et al. | |
| 2003/0224283 A1 | 12/2003 | Allen et al. | |
| 2004/0072420 A1 | 4/2004 | Enomoto et al. | |
| 2004/0102585 A1 | 5/2004 | Steinmetz et al. | |
| 2005/0019696 A1 | 1/2005 | Allen et al. | |
| 2006/0057501 A1 | 3/2006 | Wu et al. | |
| 2006/0058468 A1 | 3/2006 | Wu et al. | |
| 2006/0134546 A1 | 6/2006 | Huang et al. | |
| 2006/0134547 A1 | 6/2006 | Huang et al. | |
| 2006/0228646 A1 | 10/2006 | Zampini et al. | |
| 2006/0290429 A1 | 12/2006 | Kishioka et al. | |
| 2007/0042289 A1 | 2/2007 | Thackeray et al. | |
| 2007/0122740 A1 | 5/2007 | Hatakeyama et al. | |

FOREIGN PATENT DOCUMENTS

| | | |
|---|---|---|
| EP | 0 794 758 A2 | 9/1997 |
| EP | 0 987 600 A1 | 3/2000 |
| EP | 987600 A1 * | 3/2000 |
| EP | 1 298 493 A2 | 4/2003 |
| JP | 59-8770 A | 1/1984 |
| JP | 2002-14474 A | 1/2002 |
| JP | 2002-14791 | 5/2002 |
| JP | 2007/72102 A | 3/2007 |
| WO | WO 97/33198 A1 | 9/1997 |
| WO | WO 00/17712 A1 | 3/2000 |
| WO | WO 00/67072 | 9/2000 |
| WO | WO 2004/004369 A2 | 5/2004 |
| WO | WO 2004/040369 A2 | 5/2004 |
| WO | WO 2006/030320 A2 | 3/2006 |
| WO | WO 2006/085220 A2 | 8/2006 |

OTHER PUBLICATIONS

English Language Abstract of JP 2002-148791.
Notification of Transmittal of the International Search Report and the Written Opinion of the International Searching Authority, or the Declaration (Form PCT/ISA/220); International Search Report (Form PCT/ISA/210); and Written Opinion of the International Searching Authority (Form PCT/ISA/237) for PCT/IB2005/003232.

(Continued)

*Primary Examiner*—Amanda C. Walke
(74) *Attorney, Agent, or Firm*—Sangya Jain

(57) ABSTRACT

The present invention relates to a coating solution comprising a polymer obtained by reacting a glycoluril compound with at least one reactive compound containing at least one hydroxy group and/or at least one acid group, and further where the polymer is soluble in an organic solvent. The invention also relates to a process for imaging a photoresist coated over such a coating composition and to a polymer for the coating composition.

27 Claims, No Drawings

OTHER PUBLICATIONS

Iwasa et al., "Novel negative photoresist based on polar alicyclic polymers for ArF excimer laser lithography", SPIE vol. 3333, pp. 417-pp. 424, 1998, XP002369065.

Trefonas et al., "Organic Antireflective Coatings for 193nm Lithography", SPIE vol. 3678, pp. 2-pp. 12, 1999, XP002369064.

Xu, G. et al., "New Antireflective Coatings for 193 nm Lithography", Proceedings of the SPIE, vol. 3333, pp. 524-pp. 531 (1998).

Notification of Transmittal of the International Search Report and the Written Opinion of the International Searching Authority, or the Declaration (Form PCT/ISA/220), International Search Report (Form PCT/ISA/210), and Written Opinion of the International Search Authority (Form PCT/ISA/237) for PCT/IB2005/003074.

Office Action from U.S. Appl. No. 11/262,639.

Takei, S. et al., "New advanced BARC and gap fill materials based on sublimate reduction for 193nm lithography", Proceedings of the SPIE, vol. 6153, pp. 6513Q1-pp. 6513Q10 (2006).

Notification Concerning Transmittal of International Preliminary Report on Patentability (Chapter I of the Patent Cooperation Treaty) (Form PCT/IB/326), International Preliminary Report on Patentability (Form PCT/IB/373), and Written Opinion of the International Searching Authority (Form PCt/ISA/237) for PCT/IB2006/0003074.

Notification of Transmittal of the International Search Report and the Written Opinion of the International Searching Authority, or the Declaration (Form PCT/ISA/220), the International Search Report (Form PCT/ISA/210), and the Written Opinion of the International Searching Authority (Form PCT/ISA/237) for PCT/IB2008/002132 dated Mar. 3, 2009.

\* cited by examiner

ANTIREFLECTIVE COMPOSITIONS FOR PHOTORESISTS

CROSS REFERENCE TO RELATED APPLICATION

This application is a continuation-in-part of U.S. patent application Ser. No. 10/941,221 filed Sep. 15, 2004 now abandoned. The contents of which are hereby incorporated herein by reference.

FIELD OF INVENTION

The present invention relates to novel coating compositions and their use in image processing by forming a thin layer of the novel coating composition between a reflective substrate and a photoresist coating. Such compositions are particularly useful in the fabrication of semiconductor devices by photolithographic techniques. The invention further relates to a polymer for the coating composition.

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

High resolution, chemically amplified, deep ultraviolet (100-300 nm) positive and negative tone photoresists are available for patterning images with less than quarter micron geometries. There are two major deep ultraviolet (uv) exposure technologies that have provided significant advancement in miniaturization, and these are lasers that emit radiation at 248 nm and 193 nm. Examples of such photoresists are given in the following patents and incorporated herein by reference, U.S. Pat. No. 4,491,628, U.S. Pat. No. 5,350,660, EP 794458 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by not having aromatics present. Furthermore, at lower wavelengths the reflection from the substrate becomes increasingly detrimental to the lithographic performance of the photoresist. Therefore, at these wavelengths antireflective coatings become critical.

The use of highly absorbing antireflective coatings in photolithography is a simpler approach to diminish the problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the resist film as the thickness of the resist changes. Reflective notching becomes severe as the photoresist is patterned over substrates containing topographical features, which scatter light through the photoresist film, leading to line width variations, and in the extreme case, forming regions with complete photoresist loss.

In the past dyed photoresists have been utilized to solve these reflectivity problems. However, it is generally known that dyed resists only reduce reflectivity from the substrate but do not substantially eliminate it. In addition, dyed resists also cause reduction in the lithographic performance of the photoresist, together with possible sublimation of the dye and incompatibility of the dye in resist films.

In cases where further reduction or elimination of line width variation is required, the use of bottom antireflective coating provides the best solution for the elimination of reflectivity. The bottom antireflective coating is applied to the substrate prior to coating with the photoresist and prior to exposure. The resist is exposed imagewise and developed. The antireflective coating in the exposed area is then etched, typically in an oxygen plasma, and the resist pattern is thus transferred to the substrate. The etch rate of the antireflective film should be relatively high in comparison to the photoresist so that the antireflective film is etched without excessive loss of the resist film during the etch process. Inorganic types of antireflective coatings include such films as TiN, TiON, TiW and spin-on organic polymer in the range of 30 nm. Inorganic B.A.R.C.s require precise control of the film thickness, uniformity of film, special deposition equipment, complex adhesion promotion techniques prior to resist coating, separate dry etching pattern transfer step, and dry etching for removal.

Organic B.A.R.C.s are more preferred and have been formulated by adding dyes to a polymer coating (Proc. SPIE, Vol. 1086 (1989), p. 106). Problems of such dye blended coatings include 1) separation of the polymer and dye components during spin coating 2) dye stripping into resist solvents, and 3) thermal diffusion into the resist upon the baking process. All these effects cause degradation of photoresist properties and therefore are not the preferred composition.

Light absorbing, film forming polymers are another option. Polymeric organic antireflective coatings are known in the art as described in EP 583,205, and incorporated herein by reference. However, these polymers have been found to be ineffective when used as antireflective coatings for photoresists sensitive to 193 nm. It is believed that such antireflective polymers are very aromatic in nature and thus are too reflective, acting as a mirror rather than absorbers. Additionally, these polymers being highly aromatic, have too low a dry etch rate, relative to the new type of non-aromatic photoresists used for 193 nm exposure, and are therefore ineffective for imaging and etching. Photoresist patterns may be damaged or may not be transferred exactly to the substrate if the dry etch rate of the antireflective coating is similar to or less than the etch rate of the photoresist coated on top of the antireflective coating.

Therefore, it is necessary to have a bottom antireflective coating that functions well at exposures less than 230 nm. Such antireflective coatings need to have high etch rates in a plasma and be sufficiently absorbing to act as antireflective coatings. U.S. Pat. No. 5,935,760 describes a bottom antireflective coating based on a very specific crosslinkable polyester polymer. U.S. Pat. No. 4,255,558 discloses a self-curing polymer formed by the condensation of a glycoluril and polyhydroxyl material to give a thermosetting powder.

The novel antireflective coatings of the present invention, comprising a polymer which is soluble in an organic solvent, have been found to have good dry etching properties, which enable a good image transfer from the photoresist to the substrate, and also good absorption characteristics to prevent reflective notching and line width variations or standing waves, particularly at 193 nm. Further, the polymer of the present invention is soluble in organic solvents, thus good coatings can be formed on the substrate. The antireflective coating of the present invention has a relatively high etch rate such that the antireflective coating is removed with minimal loss in the thickness of the photoresist layer. Additionally, substantially no intermixing is present between the antireflective coating and the photoresist film. The antireflective coating solutions also have good solution stability and form particularly thin films with good coating quality, the latter being particularly advantageous for lithography. When the antireflective coating is used with a photoresist in the imaging process, clean images are obtained with good lithographic properties.

SUMMARY

The present invention relates to a coating solution comprising a polymer obtained by reacting a glycoluril compound with at least one reactive compound containing at least one hydroxy group and/or at least one acid group, and further where the polymer is soluble in an organic solvent. The coating composition also contains a chromophore group either bound to the polymer or as an additive. The present invention also relates to the coating solution further comprising a crosslinkable polymer. The invention also relates to a process for imaging such a coating composition and to a polymer for the coating composition.

DESCRIPTION OF THE INVENTION

The invention relates to a novel polymer and also to an antireflective coating solution comprising the novel polymer. The invention further relates to a process for imaging the coating solution. The novel polymer of the present invention is obtained by reacting at least one glycoluril compound with at least one reactive compound containing at least one hydroxy group and/or one acid group. In one embodiment the reactive compound comprises 2 or more hydroxy groups (polyhydroxy compound or polyol), a compound containing 2 or more acid groups (polyacid compound), or a hybrid compound containing both a hydroxy and an acid group. In another embodiment of the polymer, the polymer is obtained by reacting at least one glycoluril compound with at least one reactive compound containing one hydroxy group or one acid group. In yet another embodiment the novel polymer is obtained by reacting at least one glycoluril compound with a mixture comprising at least one reactive compound containing at least one hydroxy group or one acid group and at least one reactive compound comprising 2 or more hydroxy groups (polyhydroxy compound or polyol), a compound containing 2 or more acid groups (polyacid compound), or a hybrid compound containing both a hydroxy and an acid group. The coating solution also contains a chromophore group which absorbs radiation and therefore can act as an antireflective coating when exposed to imaging radiation. The chromophore may be present in the novel polymer or, alternatively, the chromophore group may be present as an additive compound in the coating composition. The antireflective coating comprises the novel polymer and an organic solvent, and for this purpose, the polymer is soluble in an organic solvent so that a good quality coating may be formed. Upon heating at sufficiently high temperatures the coating is curable since the polymer can self crosslink. A photoresist coating is then formed over the antireflective film and is further imaged. The novel polymer of the present invention may additionally be a low molecular weight oligomer which acts as a crosslinking compound for a crosslinkable polymer, where the coating solution comprises the oligomer and the crosslinkable polymer.

The polymer of the present invention is formed from the condensation reaction of a reactive comonomer containing hydroxy groups and/or acid groups with a glycoluril compound. In the case of one embodiment, at least two reactive groups (hydroxy and/or acid) should be available in the comonomer which reacts with the gycoluril. The polymerization reaction may be catalyzed with an acid. In the case of another embodiment, the glycoluril compound may condense with itself or with another polyol, polyacid or hybrid compound, and additionally, incorporate into the polymer a compound with one hydroxy and/or one acid group. Thus the polymer comprises monomeric units derived from glycoluril and reactive compounds containing a mixture of hydroxy and/or acid groups.

The glycoluril compounds are known and available commercially, and are further described in U.S. Pat. No. 4,064,191. Glycolurils are synthesized by reacting two moles of urea with one mole of glyoxal. The glycoluril can then be fully or partially methylolated with formaldehyde. A glycoluril compound containing the moiety of the general description as shown in Structure 1, is useful as a comonomer for the polymer of the present invention and becomes incorporated into the novel polymer.

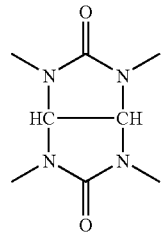

Structure 1

More specifically, the glycouril comonomer has the Structure 2, where $R_1$, $R_2$, $R_3$, and $R_4$ are independently H or $(C_1\text{-}C_{10})$ alkyl.

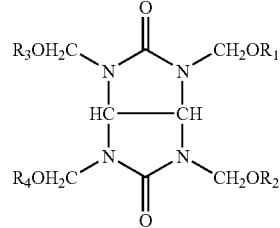

Structure 2

Nonlimiting examples of glycolurils are tetramethylol glycoluril, tetrabutoxymethyl glycoluril, tetramethoxymethyl glycoluril, partially methoylated glycoluril, tetramethoxymethyl glycoluril, dimethoxymethyl glycoluril, mono- and dimethylether of dimethylol glycoluril, trimethylether of tetramethylol glycoluril, tetramethylether of tetramethylol glycoluril, tetrakisethoxymethyl glycoluril, tetrakispropoxymethyl glycoluril, tetrakisbutoxymethyl glycoluril, tetrakisamyloxymethyl glycoluril, tetrakishexoxymethyl glycoluril, and the like. The glycoluril may also be in the form of an oligomer.

The polyhydroxy compound useful as the comonomer for polymerizing with the glycoluril may be a compound containing 2 or more hydroxyl groups or be able to provide 2 or more hydroxyl groups, such as diol, triol, tetrol, glycol, aromatic compounds with 2 or more hydroxyl groups, or polymers with end-capped hydroxyl groups or epoxide groups. More specifically, the polyhydroxy compound may be ethylene glycol, diethylene glycol, propylene glycol, neopentyl glycol, polyethylene glycol, styrene glycol, propylene oxide, ethylene oxide, butylene oxide, hexane diol, butane diol, 1-phenyl-1,2-ethanediol, 2-bromo-2-nitro-1,3-propane diol, 2-methyl-2-nitro-1,3-propanediol, diethylbis(hydroxymethyl)malonate, hydroquinone, and 3,6-dithia-1,8-octanediol. Further examples of aromatic diols are Bisphenol A, 2,6-bis(hydroxymethyl)-p-cresol and 2,2'-(1,2-phenylenedioxy)-diethanol, 1,4-benzenedimethanol, 2-benzyloxy-1,3-propanediol, 3-phenoxy-1,2-propanediol, 2,2'-biphenyldimethanol, 4-hydroxybenzyl alcohol, 1,2-benzenedimethanol, 2,2'-(o-phenylenedioxy)diethanol, 1,7-dihydroxynaphthalene, 1,5-naphthalenediol, 9,10-anthracenediol, 9,10-anthracenedimethanol, 2,7,9-anthracenetriol, other naphthyl diols and other anthracyl diols.

The polyacid compound useful as the reactive comonomer for polymerizing with the glycoluril may be a compound containing 2 or more acid groups or be able to provide 2 or more acidic groups, such as diacid, triacid, tetracid, anhydride, aromatic compounds with 2 or more acid groups, aromatic anhydrides, aromatic dianhydrides, or polymers with end-capped acid or anhydride groups. More specifically, the polyacid compound may be phenylsuccinic acid, benzylmalonic acid, 3-phenylglutaric acid 1,4-phenyldiacetic acid, oxalic acid, malonic acid, succinic acid, pyromellitic dianhydride, 3,3',4,4'-benzophenone-tetracarboxylic dianhydride, naphthalene dianhydride, 2,3,6,7-naphthalenetetracarboxylic acid dianhydride and 1,4,5,8-naphthalenetetracarboxylic acid dianhydride, and anthracene diaacid.

Hybrid compounds containing a mixture of hydroxyl and acid groups may also function as comonomers, and may be exemplified by 3-hydroxyphenylacetic acid and 2-(4-hydroxyphenoxy)propionic acid.

The reactive comonomers, in addition to containing a hydroxyl and/or acid group, may also contain a radiation absorbing chromophore, where the chrompophore absorbs radiation in the range of about 450 nm to about 140 nm. In particular for antireflective coatings useful for imaging in the deep uv (250 nm to 140 nm), aromatic moieties are known to provide the desirable absorption characteristics. These chromophores may be aromatic or heteroaromatic moieties, examples of which are substituted or unsubstituted phenyl, substituted or unsubstituted naphthyl, and substituted or unsubstituted anthracyl. Typically, anthracyl moieties are useful for 248 nm exposure, and phenyl moieties are useful for 193 nm exposure. The aromatic groups may have pendant hydroxy and/or acid groups or groups capable of providing hydroxy or acid groups (e.g. epoxide or anhydride) either attached directly to the aromatic moiety or through other groups, where these hydroxy or acid groups provide the reaction site for the polymerization process. As an example, styrene glycol or an anthracene derivative, may be polymerized with a glycoluril of Structure 2.

In another embodiment the chromophore group may be present as an additive, where the additive is a monomeric or polymeric compound. Monomers containing substituted or unsubstituted phenyl, substituted or unsubstituted naphthyl, and substituted or unsubstituted anthracyl may be used. Aromatic polymers function well as chromophoric additives. Example of chromphoric polymers are ones polymerized with at least one or more of the following comonomers: styrene or its derivatives, phenols or its derivatives and an aldehyde, and (meth)acrylates with pendant phenyl, naphthyl or anthracyl groups. More specifically the monomers can be 4-hydroxystyrene, styrene glycol, cresol and formaldehyde, 1-phenyl-1,2-ethanediol, bisphenol A, 2,6-bis(hydroxymethyl)-p-cresol, ethylene glycol phenyl ether acrylate, 2-(4-benzoyl-3-hydroxyphenoxy)ethyl acrylate, 2-hydroxy-3-phenoxypropyl acrylate, benzyl methacrylate, 2,2'-(1,2-phenylenedioxy)-diethanol, 1,4-benzenedimethanol, naphthyl diols, anthracyl diols, phenylsuccinic acid, benzylmalonic acid, 3-phenylglutaric acid, 1,4-phenyldiacetic acid, pyromellitic dianhydride, 3,3', 4,4'-benzophenone-tetracarboxylic dianhydride, naphthalene dianhydride, 2,3,6,7-naphthalenetetracarboxylic acid dianhydride, 1,4,5,8-naphthalenetetracarboxylic acid dianhydride, 9-anthracene methacrylate, and anthracene diaacid.

In certain instances it is important to control the etch resistance and absorptivity of the antireflective coating. In order to provide the desired etch rate of the antireflective coating, especially for imaging below 200 nm, the degree of aromaticity in the polymer may be varied. For high etch rates the aromatic component in the polymer backbone is reduced. It is generally known to those of ordinary skill in the art that aromatics decrease the etch rate. For low etch rates and/or high absorptivity, highly aromatic polymers are desirable. However, in some embodiments, particularly for imaging at wavelengths below 200 nm, optimum performance may be obtained by controlling the etch rate and the absorptivity by using an appropriate mixture of an aliphatic and an aromatic monomer. The aromatic functionality may also be incorporated at other functional points within the polymer. In cases where the absorbing aromatic component is an additive, using the appropriate concentration of that component in the coating solution may give the optimum properties.

The polymer of the present invention is synthesized by polymerizing the comonomers described previously. Typically, the desired glycoluril or mixtures of glycolurils is reacted with the reactive compound comprising polyol, polyacid, hybrid compound with acid and hydroxyl groups, reactive compound with one hydroxy group, reactive compound with one acid group or mixtures thereof, in the presence of a suitable acid. The polymer may be a linear polymer made with a glycoluril with 2 linking sites that are reacted or a network polymer where the glycoluril has more than 2 reactive sites connected to the polymer. Other comonomers may also be added to the reaction mixture and polymerized to give the polymer of the present invention. Strong acids, such as sulfonic acids are preferred as catalyst for the polymerization reaction. A suitable reaction temperature and time is selected to give a polymer with the desired physical properties, such as molecular weight. Typically the reaction temperature may range from about room temperature to about 150° C. and the reaction time may be from 20 minutes to about 24 hours. The weight average molecular weight (Mw) of the polymer is in the range of 1,000 to 50,000, preferably 3,000 to 40,000, and more preferably 4,500 to 40,000, and even more preferably 5,000 to 35,000 for certain applications. When the weight average molecular weight is low, such as below 1,000, then good film forming properties are not obtained for the antireflective coating and when the weight average molecular weight is too high, then properties such as solubility, storage stability and the like may be compromised. However, lower molecular weight novel polymers of the present invention can function well as crosslinking compounds in conjunction with another crosslinkable polymer, especially where the molecular weight of the lower molecular weight polymer ranges from about 500 to about 20,000, and preferably 800 to 10,000.

The antireflective coating composition comprises a polymer and an organic solvent. Optionally an acid or/and an acid generator may be added to the composition. Additionally, a crosslinking agent may be added but is not completely essential to the performance of the antireflective coating. The polymer of the present invention is itself crosslinkable, but for certain embodiments, additional monomeric or polymeric crosslinkers may be added. Generally, polymeric crosslinkers may be preferred to monomeric crosslinkers, if a more stable film is desired. These crosslinkers have reactive sites (e.g. hydroxy, carboxy, etc) which can bind with the polymer of the invention.

A variety of crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol are preferred.

The acid generator of the present invention, preferably a thermal acid generator is a compound which, when heated to temperatures greater than 90° C. and less than 250° C., generates an acid. The acid enables the polymer to be crosslinked. The antireflective film after heat treatment becomes insoluble in the solvents used for coating photoresists, and furthermore, is also insoluble in the alkaline developer used to image the photoresist. Preferably, the thermal acid generator is activated at 90° C. and more preferably at above 120° C., and even more preferably at above 150° C. The antireflective film is heated for a sufficient length of time to crosslink the coating. Examples of thermal acid generators are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl-4-nitro benzenesulfonate; phenolic sulfonate esters such as phenyl, 4-methoxybenzenesulfonate; alkyl ammonium salts of organic acids, such as triethylammonium salt of 10-camphorsulfonic acid.

Thermal acid generators are preferred over free acids, although free acids may also be used, in the novel antireflective composition, since it is possible that over time the shelf stability of the antireflective solution will be affected by the presence of the acid, if the polymer were to crosslink in solution. Thermal acid generators are only activated when the antireflective film is heated on the substrate. Additionally, mixtures of thermal acids and free acids may be used. Although thermal acid generators are preferred for crosslinking the polymer efficiently, an antireflective coating composition comprising the polymer and optionally a crosslinking agent may also be used, where heating crosslinks the polymer. Examples of a free acid are, without limitation, strong acids, such as sulfonic acids. Sulfonic acids such as toluene sulfonic acid, triflic acid or mixtures of these are preferred.

The novel composition may further contain a photoacid generator, examples of which without limitation, are onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, triakylsulfonium salts, and mixtures thereof.

The amount of the polymer in the present composition can vary from about 100 weight % to about 50 weight %, preferably about 85 weight % to about 70 weight % and more preferably about 80 weight % to about 70 weight %, relative to the solid portion of the composition. The amount of optional crosslinker in the present composition can vary from 5 weight % to about 50 weight %, preferably 15 weight % to about 30 weight % relative to the solid portion of the composition. The amount of the optional acid or acid generator in the present composition can vary from 0.1 weight % to about 5 weight %, preferably 0.5 weight % to about 3 weight % and more preferably 1 weight % to about 2 weight %, relative to the solid portion of the composition.

Typical solvents, used as mixtures or alone, that can be used for the present composition, without limitation, are propylene glycol monomethyl ether acetate (PGMEA), propylene gycol monomethyl ether (PGME), and ethyl lactate (EL), 2-heptanone, cyclopentanone, cyclohexanone, and gamma butyrolactone, but PGME, PGMEA and EL or mixtures thereof are preferred. Solvents with a lower degree of toxicity, good coating and solubility properties are generally preferred.

The antireflective coating composition comprises the polymer, the acid generator and a suitable solvent or mixtures of solvents. Other components may be added to enhance the performance of the coating, e.g. monomeric dyes, polymeric dyes, monomeric or polymeric crosslinkers, lower alcohols, surface leveling agents, adhesion promoters, antifoaming agents, etc. Other secondary polymers, which can function as dyes and/or crosslinkers may be used, such as, novolaks, polyhydroxystyrene, polymethacrylate, polyarylates, poly (hydroxystyrene-methylmethacrylate), homopolymers and/or copolymers obtained by polymerization of at least one of the following monomers: styrene, hydroxystyrene, hydroxyethyl(methyl)acrylate, hydroxypropyl(methyl)acrylate, methyl(methyl)acrylate, ethyl(methyl)acrylate, (methyl) acrylic acid, polymers described in U.S. Pat. No. 6,465,148, U.S. Pat. No. 5,733,714, U.S. Pat. No. 6,737,492, U.S. Pat. No. 6,187,506 and U.S. Pat. No. 5,981,145. The optional secondary polymer may be up to 95 weight % of the total solids of the composition, preferably 5 weight % to 60 weight %; but ultimately, the amount of the secondary polymers added depends on the lithographic properties desired.

In one embodiment of the present invention the coating solution comprises a solvent and the novel polymer, where the novel polymer is essentially a condensation product of the glycoluril compound and further reacts with a monohydroxy and/or monoacid compound. The polymer may further comprise units derived from the monomers comprising multihydroxy groups, multiacid groups or mixture of hydroxyl and acid groups. The glycoluril compounds, multihydroxy groups, multiacid groups or mixture of hydroxy and acid groups are described previously in the application. The glycoluril compound selfcondenses to form a polymer and then further reacts with a monohydroxy compound to incorporate the chromophore. Alternatively, the glycoluril compound reacts with a polyol, polyacid or hybrid compound to give a polymer which further reacts with the compound(s) containing the monofunctional hydroxy or monoacid group. The novel polymer may be used as the self-crosslinking polymer. Nonlimiting examples of the monohydroxy and monoacid compounds are preferably one which has a chromophoric group also, and examples of such compounds are phenol, o-cresol, 2-ethoxyphenol, p-methoxyphenol, m-cresol, 4-ethylphenol, 4-propylphenol, 4-fluorophenol, 2,3-dimethoxyphenol, 2,6-dimethylphenol, 2,4-dimethylphenol, 3,4,5-trimethylphenol, 1-naphthol, 2-naphthol, 4-methoxy-1-naphthol, 2-phenylphenol, 4-(benzyloxy)phenol, benzyl alcohol, 2-methylbenzyl alcohol, 2-methoxybenzyl alcohol, 3-methylbenzyl alcohol, 3-(trifluromethyl)benzyl alcohol, 4-ethylbenzyl alcohol, 4-ethoxybenzyl alcohol, 4-(trifluromethoxy)benzyl alcohol, 3,5-difluorobenzyl alcohol, 2,4,5-trimethoxybenzyl alcohol, 4-benzyloxybenzyl alcohol, 1-naphthalenethanol, 2-phenyl-1-propanol, 2,2-diphenylethanol, 4-phenyl-1-butanol, 2-phenoxyethanol, 4-methoxyphenethyl alcohol, 2-hydroxybenzophenone, phenylacetic acid, 1-naphthylacetic acid, etc. The weight average molecular weight of the novel polymer may range from 1000 to 30,000, and more preferably 1,500 to 15,000. The coating solution may further comprise an acid and/or acid generator, secondary polymers and additives, all of which are described previously in the present application. Typical solvents, acids and acid generators have been described previously. The amount of the novel polymer in the present composition can vary from about 100 weight % to about 50 weight %, preferably about 85 weight % to about 70 weight % and more preferably about 80 weight % to about 70 weight %, relative to the solid portion of the composition. The amount of optional crosslinker in the present composition can vary from 5 weight % to about 50 weight %, preferably 15 weight % to about 30 weight % relative to the solid portion of the composition. The amount of the optional acid or acid generator in the present composition can vary from 0.1 weight % to about 5 weight %, preferably 0.5 weight % to about 3 weight % and more preferably 1 weight % to about 2 weight %, relative to the solid portion of the composition.

In another embodiment of the present invention the coating solution comprises a solvent and the novel polymer of the present invention, where this polymer functions as a crosslinking compound, and the solution further comprises a crosslinkable polymer. The polymer is synthesized as described previously in the application. In this embodiment, a low molecular weight novel polymer, such as a polymer containing the low molecular weight fraction, is preferred. Crosslinkers that are oligomeric or polymeric can provide more stable films than monomeric crosslinkers, and are thus preferred. Typically the molecular weight of the novel oligomeric crosslinking compound ranges from about 500 to about 20,000, preferably 800 to 15,000, and more preferably from 800 to 10,000. The weight average molecular weight of the oligomeric crosslinking compound can range from 800 to about 10,000, and preferably 1,000 to 8,000. The oligomer may be made from the monomers described previously in the present application or may be fractionated from the higher molecular weight polymers described previously. Solvent extraction or fractionation as known in the art may be used. Typically the polymer is dissolved in a solvent or mixture of solvents which selectively extracts certain range of molecular weights of the polymer and the extract or the residual portion may be precipitated and cleaned to give the desired portion of the polymer or used in solution. A coating composition comprising the fractionated or unfractionated low molecular weight novel polymer of the present invention (crosslinking compound), a crosslinkable polymer and solvent is formulated. The composition contains none or very insignificant amounts of the monomers used to make the polymer or oligomers. The crosslinkable polymer is one or mixture of polymers which comprise reactive groups which can crosslink with the polymer of the present invention. Nonlimiting examples of the various types of crosslinkable polymers would be ones which contain functionalities which crosslink, such as acids, alcohols, esters, ethers, etc. Particularly preferred are polymers containing hydroxyl groups, carboxylic acid groups, carboxylic esters, epoxy groups, urethanes and amides. Crosslinkable polymers, which may also be used as dyes, may be used, such as, novolaks, polyhydroxystyrene, polymethacrylate, polyarylates, polyesters, polyurethanes, and alkyd resins (aliphatic polyesters). Useful polymers are exemplified by poly(hydroxystyrene-methylmethacrylate), homopolymers and/or copolymers obtained by polymerization of at least one of the following monomers: styrene, hydroxystyrene, hydroxyethyl(methyl)acrylate, hydroxypropyl(methyl)acrylate, methyl(methyl)acrylate, ethyl(methyl) acrylate, (methyl)acrylic acid, polymers described in U.S. Pat. No. 6,465,148, U.S. Pat. No. 5,733,714, U.S. Pat. No. 6,737,492, U.S. Pat. No. 6,187,506, U.S. Pat. No. 5,981,145 and US2004-0101779, all of which are incorporated herein by reference. Specific examples of crosslinkable polymers are poly(hydroxystyrene-styrene-methacrylate), poly(4-hydroxystyrene), and poly(pyromellitic dianhydride-ethylene glycol-propylene oxide). The coating composition may further comprise an acid and/or acid generator, secondary polymers and additives, all of which are described previously in the present application. Typical solvents, acids and acid generators have been described previously. The low molecular weight polymer of the present invention may be present at concentrations ranging from about 10% to about 50% by solids. The crosslinkable polymer is present at levels of about 90% to about 50% by solids.

The optical characteristics of the antireflective coating are optimized for the exposure wavelength and other desired lithographic characteristics. As an example the absorption parameter (k) of the novel composition for 193 nm exposure ranges from about 0.1 to about 1.0, preferably from about 0.2 to about 0.75, more preferably from about 0.25 to about 0.65 as measured using ellipsometry. The value of the refractive index (n) ranges from about 1.25 to about 2.0, preferably from about 1.3 to about 2.0, and more preferably from about 1.5 to about 2.0.

Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spin coating or spraying. The film thickness of the antireflective coating ranges from about 20 nm to about 200 nm. The optimum film thickness is determined, as is well known in the art, to be where no standing waves are observed in the photoresist. It has been unexpectedly found that for this novel composition very thin coatings can be used due to the excellent absorption and refractive index properties of the film. The coating is further heated on a hot plate or convection oven for a sufficient length of time to remove any residual solvent and induce crosslinking, and thus insolubilizing the antireflective coating to prevent intermixing between the antireflective coating and the photoresist layer.

Photoresists can be any of the types used in the semiconductor industry, provided the photoactive compound in the photoresist and the antireflective coating absorb at the exposure wavelength used for the imaging process.

There are two types of photoresist compositions, negative-working and positive-working. When negative-working photoresist compositions are exposed image-wise to radiation, the areas of the resist composition exposed to the radiation become less soluble to a developer solution (e.g. a crosslinking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Any photoresists sensitive to ultraviolet radiation may be used. Photoresists based on novolac resins and diazonaphthoquinone diazide are suitable for radiation wavelengths between 450 nm and 300 nm. Such photoresists are described in U.S. Pat. No. 5,162,510 and U.S. Pat. No. 5,371,169. Photoresists sensitive at short wavelengths, between about 180 nm and about 300 nm can also be used in the present invention. These photoresists normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. No. 4,491,628, U.S. Pat. No. 5,069,997 and U.S. Pat. No. 5,350,660. Particularly preferred for 193 nm and 157 nm exposure are photoresists comprising non-aromatic polymers, a photoacid generator, optionally a solubility inhibitor, and solvent. Photoresists sensitive at 193 nm that are known in the prior art are described in the following references and incorporated herein, EP 794458, WO 97/33198 and U.S. Pat. No. 5,585,219, although any photoresist sensitive at 193 nm may be used on top of the antireflective composition of this invention. Fluorinated polymers are known for being transparent at 193 nm and 157 nm. Such polymers when used in a photoresist are disclosed in EP 789,278, WO 00/67072 and WO 00/17712. WO 00/67072 specifically discloses nonaromatic, alicyclic polymers with pendant fluorinated groups.

The process of the instant invention further comprises coating a substrate with the novel antireflective coating and heating on a hotplate or convection oven at a sufficiently high temperature for sufficient length of time to remove the coating solvent, and crosslink the polymer to a sufficient extent so that the coating is not soluble in the coating solution of the photoresist or in the aqueous alkaline developer. An edge bead remover may be applied to clean the edges of the substrate using processes well known in the art. The preferred range of temperature is from about 90° C. to about 250° C. If the temperature is below 90° C. then insufficient loss of solvent or insufficient amount of crosslinking takes place, and at temperatures above 250° C. the composition may become chemically unstable. A film of photoresist is then coated on top of the antireflective coating and baked to substantially remove the photoresist solvent. The photoresist is imagewise exposed and developed in an aqueous developer to remove the treated photoresist. The developer is preferably an aqueous alkaline solution comprising, for example, tetramethyl ammonium hydroxide. An optional heating step can be incorporated into the process prior to development and after exposure. The developer may additionally contain additives to enhance the imaging process, such as surfactants, polymers, etc.

The process of coating and imaging photoresists is well known to those skilled in the art and is optimized for the specific type of resist used. The patterned substrate can then be dry etched with an etching gas or mixture of gases, in a suitable etch chamber to remove the exposed portions of the antireflective film, with the remaining photoresist acting as an etch mask. Various gases are known in the art for etching organic antireflective coatings, such as $O_2$, $Cl_2$, $F_2$ and $CF_4$.

An intermediate layer may be placed between the antireflective coating and the photoresist to prevent intermixing, and is envisioned as lying within the scope of this invention. The intermediate layer is an inert polymer cast from a solvent, where examples of the polymer are polysulfones and polyimides.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer.

The molecular weight of the polymers was measured on a Gel Permeation Chromatograph.

Synthesis Example 1

600 grams of tetramethoxymethyl glycoluril, 96 grams of styrene glycol and 1200 grams of propyleneglycolmonomethyl ether acetate (PGMEA) were charged into a 2 liter(l) jacketed flask with a thermometer, mechanical stirrer and a cold water condenser and heated to 85° C. A catalytical amount of para-toluenesulfonic acid monohydrate was added, and the reaction was maintained at this temperature for 5 hrs. The reaction solution was then cooled to room temperature and filtered. The filtrate was slowly poured into distilled water to precipitate the polymer. The polymer was filtered, washed thoroughly with water and dried in a vacuum oven (250 grams of the polymer were obtained). The polymer obtained had a weight average molecular weight of about 17,345 g/mol and a polydispersity of 2.7. H$^1$NMR showed that the polymer was a condensation product of the two starting materials. A broad peak centered at 7.3 ppm was indicative of the benzene moiety present in the polymer and the broad peak centered at 3.3 ppm was contributed by unreacted methoxy groups ($CH_3O$) on tetramethoxymethyl glycoluril.

Synthesis Example 2

260 grams of tetramethoxymethyl glycoluril, 41.6 grams of neopentyl glycol and 520 grams of PGMEA were charged into a 2 l jacketed flask with a thermometer, mechanical stirrer and a cold water condenser and heated to 85° C. A catalytical amount of para-toluenesulfonic acid monohydrate was added, and the reaction was maintained at this temperature for 5 hrs. The reaction solution was then cooled to room temperature and filtered. The filtrate was slowly poured into distilled water while stirring in order to precipitate the polymer. The polymer was filtered, washed thoroughly with water and dried in a vacuum oven (250 grams of the polymer were obtained). The polymer obtained had a weight average molecular weight of about 18,300 g/mol and a polydispersity of 2.8. A broad peak centered at 0.9 ppm assigned to methyl groups of neopentyl glycol and the broad peak centered at 3.3 ppm characteristic of unreacted methoxy groups ($CH_3O$) on tetramethoxymethyl glycoluril showed that the polymer obtained was a condensation product of the two starting materials.

Synthesis Example 3

50 grams of tetramethoxymethyl glycoluril, 23.9 grams of styrene glycol, and 35 grams of 2-methyl-2-nitro-propanediol were charged into a 500 ml jacketed flask with a thermometer and mechanical stirrer. The reaction mixture was heated to 100° C. and a clear solution was obtained. A catalytical amount of para-toluenesulfonic acid monohydrate was added, and the reaction was maintained for 60 minutes. Then 60 grams of PGMEA was added and the reaction was maintained for another 2 hrs. The reaction solution was then cooled to room temperature and filtered. The filtrate was slowly poured into ether while stirring to precipitate the polymer. The polymer was filtered, washed thoroughly with ether and dried in a vacuum oven (33 grams of the polymer were obtained). The polymer obtained had a weight average molecular weight of about 6,305 g/mol and a polydispersity of 2.6.

Synthesis Example 4

50 grams of tetramethoxymethyl glycoluril and 20 grams of styrene glycol were charged into a 500 ml jacketed flask with a thermometer and a mechanical stirrer. The reaction mixture was heated to 100° C. A catalytical amount of para-toluenesulfonic acid monohydrate was added, the reaction was maintained at this temperature for 60 min. Then 50 grams of PGMEA was added and the reaction was maintained for another 3 hrs. The reaction solution was then cooled to room temperature and filtered. The filtrate was slowly poured into distilled water while stirring to precipitate the polymer. The polymer was filtered, washed thoroughly with water and dried in a vacuum oven (40 grams of the polymer were obtained). The polymer obtained had a weight average molecular weight of about 16,327 g/mol and a polydispersity of 6.7. H$^1$NMR showed that the polymer was a condensation product of the two starting materials. A broad peak centered at 7.3 ppm was indicative of benzene moiety in the polymer and the broad peak centered at 3.3 ppm was contributed by unreacted methyl groups on tetramethoxymethyl glycoluril.

Synthesis Example 5

50 grams of tetramethoxymethyl glycoluril, 20 grams of styrene glycol, and 20 grams of polyethylene glycol (number average molecular weight, Mn, of 1000 g/mol) were charged into a 500 ml jacketed flask with a thermometer and a mechanical stirrer. The reaction mixture was heated to 98° C. A catalytical amount of para-toluenesulfonic acid monohydrate was added, the reaction was maintained at this temperature for 60 min. Then 60 grams of propyleneglycolmonomethyl ether acetate (PGMEA) was added and the reaction was maintained for another three and half hours. The reaction solution was then cooled to room temperature and filtered. The filtrate was slowly poured into ether while stirring to precipitate the polymer. The polymer was filtered, washed thoroughly with ether and dried in a vacuum oven (50 grams of the polymer were obtained). The polymer obtained had a weight average molecular weight of about 4,195 g/mol and a polydispersity of 2.04.

Synthesis Example 6

50 grams of tetramethoxymethyl glycoluril, 20 grams of styrene glycol, and 23 grams of dimethyltartate were charged into a 500 mL jacketed flask with a thermometer and a mechanical stirrer. The reaction mixture was heated to 96° C. After catalytical amount of para-toluenesulfonic acid monohydrate was added, the reaction was maintained at this temperature for 1 hr. Then 50 grams of PGMEA was added, the reaction was maintained for another 1 hr. The reaction solution was then cooled to room temperature and filtered. The filtrate was slowly poured into either under stirring to precipitate the polymer. The polymer was filtered, washed thoroughly with ether and dried in a vacuum oven (8 grams obtained). The polymer obtained had a weight average molecular weight of about 4,137 g/mol and a polydispersity of 2.31.

Synthesis Example 7

95.5 grams of tetramethoxymethyl glycoluril, 28.36 grams of 1,6-hexanediol and 570 grams of 2-heptanone were charged into a 1 liter flask in a oil bath with a thermometer, mechanical stirrer and a condenser. The contents were heated to 80° C. and a catalytic amount of 4-ethylbenzenesulfonic acid was added. The reaction was maintained at this temperature for 2 hrs. The reaction solution was then cooled to room temperature and a stoichiometric amount of pyridine was added. The polymer product was analyzed by Gel Permeation Chromatography (GPC) and had a molecular weight ranging from 800 to 10,000, and with an approximate weight average molecular weight of about 5,000.

Synthesis Example 8

45 grams of tetramethoxymethyl glycoluril, 12.8 grams of 1,4-butanediol and 300 grams of ethylene glycol dimethyl ether were charged into a 500 ml flask fitted with a thermometer, mechanical stirrer and a condenser. The contents were heated to reflux and a catalytic amount of Amberlyst 15 (available from Sigma-Aldrich, Milwaukee, Wis.) was added. The reaction was maintained at this temperature for 1.5 hrs. The reaction solution was then cooled to room temperature and Amberlyst 15 was filtered off. The polymer product was analyzed by GPC and had a molecular weight ranging from 800 to 10,000, and with a weight average molecular weight of about 5,000.

Synthesis Example 9

To a 2-Liter flask equipped with a mechanical stirrer, a heating mantle and a temperature controller were added 400 grams of MX270 (a glycoluril available from Sanwa Chemicals, Japan), 132 grams of neopentyl glycol and 1050 grams of PGMEA. The solution was stirred at 85° C. When the reaction temperature reached 85° C., 6.0 grams of para-toluenesulfonic acid monohydrate was added. The reaction mixture was kept at 85° C. for 6 hours. The heater was turned off and 3.2 grams of triethylamine added. When the reaction mixture cooled down to room temperature, a white gum polymer was isolated. The polymer was transferred to a container and dried under the vacuum to give a white brittle polymer. The polymer product was analyzed by GPC and had a molecular weight ranging from 800 to 10,000, and with a weight average molecular weight of about 5,000.

Synthesis Example 10

90 grams of tetramethoxymethyl glycoluril, 12 grams of 1,4 benzenedimethanol, 15 grams of neopentyl glycol, 23 grams of 3,4,5-trimethoxybenzyl alcohol and 300 grams of PGMEA were charged into a 500 ml flask with a thermometer, a cold water condenser and a mechanical stirrer. The reaction mixture was heated to 85° C. After a catalytic amount of para-toluenesulfonic acid monohydrate was added, the reaction was maintained at this temperature for 7 hours. The reaction solution was then cooled to room temperature and filtered. The filtrate was slowly poured into water under stirring to precipitate the polymer. The polymer was filtered, washed thoroughly with water and dried in a vacuum oven (45 grams obtained). The polymer obtained had a weight average molecular weight of about 5,635 g/mol and a polydispersity of 2.5.

Synthesis Example 11

90 grams of tetramethoxymethyl glycoluril, 40 grams of 1,4-benzenedimethanol, 23 grams of 3,4,5-trimethoxybenzyl alcohol and 300 grams of PGMEA were charged into a 500 ml flask with a thermometer, a cold water condenser and a mechanical stirrer. The reaction mixture was heated to 85° C. After a catalytic amount of para-toluenesulfonic acid monohydrate was added, the reaction was maintained at this temperature for 9 hours. The reaction solution was then cooled to room temperature and filtered. The filtrate was slowly poured into water while stirring to precipitate the polymer. The polymer was filtered, washed thoroughly with water and dried in a vacuum oven (70 grams obtained). The polymer obtained had a weight average molecular weight of about 7,691 g/mol and a polydispersity of 3.5.

Synthesis Example 12

180 grams of tetramethoxymethyl glycoluril, 18 grams of ethylene glycol, 35.5 grams of p-methoxy phenol and 450 grams of PGMEA were charged into a 1000 ml flask with a thermometer, a cold water condenser and a mechanical stirrer. The reaction mixture was heated to 80° C. After a catalytic amount of para-toluenesulfonic acid monohydrate was added, the reaction was maintained at this temperature for 4 hours. The reaction solution was then cooled to room temperature and filtered. The filtrate was slowly poured into water while stirring to precipitate the polymer. The polymer was filtered, washed thoroughly with water and dried in a vacuum oven (50 grams obtained). The polymer obtained had a weight average molecular weight of about 1,800 g/mol and a polydispersity of 1.5.

Synthesis Example 13

40.8 grams of tetramethoxymethyl glycoluril, 18 grams of p-methoxy phenol and 200 grams of PGMEA were charged into a 500 mL flask with a thermometer, a cold water condenser and a mechanical stirrer. The reaction mixture was heated to 85° C. After a catalytic amount of para-toluenesulfonic acid monohydrate was added, the reaction was maintained at this temperature for 3 hours. The reaction solution was then cooled to room temperature and filtered. The filtrate was slowly poured into water while stirring to precipitate the polymer. The polymer was filtered, washed thoroughly with water and dried in a vacuum oven (20 grams obtained). The polymer obtained had a weight average molecular weight of about 4,230 g/mol and a polydispersity of 3.3.

Synthesis Example 14

50.3 grams of tetramethoxymethyl glycoluril, 5 grams of neopentyl glycol, 12 grams of p-methoxy phenol and 200 grams of PGMEA were charged into a 500 mL flask with a thermometer, a cold water condenser and a mechanical stirrer. The reaction mixture was heated to 85° C. After catalytic amount of para-toluenesulfonic acid monohydrate was added, the reaction was maintained at this temperature for 4 hours. The reaction solution was then cooled to room temperature and filtered. The filtrate was slowly poured into water while stirring to precipitate the polymer. The polymer was filtered, washed thoroughly with water and dried in a vacuum oven (25 grams obtained). The polymer obtained had a weight average molecular weight of about 6,150 g/mol and a polydispersity of 2.9.

Lithographic Evaluation Example 1

An antireflective coating composition was prepared by dissolving 2.4 g of the polymer prepared in Example 1 and 0.048 g of triethylammonium salt of 10-camphorsulfonic acid in 47.6 g ethyl lactate. The solution was filtered through 0.2 μm filter.

The performance of the anti-reflective coating formulation was evaluated using AZ® EXP AX1120P photoresist (available from AZ® Electronic Materials, Clariant Corporation, Somerville, N.J.). An antireflective film from the above solution was coated on a silicon wafer and baked at 200° C. for 60 seconds. The antireflective film was found to have (n) value of 1.9 and (k) value of 0.34. Using AZ® EXP AX1120P photoresist a 330 nm film was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves, thus indicating the efficacy of the bottom anti-reflective coating.

Lithographic Evaluation Example 2

An antireflective coating composition was prepared by dissolving 1.2 g of the polymer prepared in Example 1, 1.2 grams of poly(hydroxystyrene-methylmethacrylate) copolymer (Mw of about 16,000 g/mol), 0.048 g triethylammonium salt of 10-camphorsulfonic acid in 47.6 g ethyl lactate. The solution was filtered through 0.2 µm filter.

The performance of the anti-reflective coating formulation was evaluated using AZ® EXP AX1120P photoresist (available from AZ® Electronic Materials, Clariant Corporation, Somerville, N.J.). An antireflective film from the above solution was coated on a silicon wafer and baked at 200° C. for 60 seconds. The antireflective film was found to have (n) value of 1.74 and (k) value of 0.36. Using AZ® EXP AX1120P photoresist a 330 nm film was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves, thus indicating the efficacy of the bottom anti-reflective coating.

Lithographic Evaluation Example 3

An antireflective coating composition was prepared by dissolving 0.8 grams of poly(hydroxystyrene-methylmethacrylate) copolymer, 0.2 grams of polymer prepared in Example 2, 0.048 g triethylammonium salt of 10-camphorsulfonic acid in 47.6 g ethyl lactate. The solution was filtered through 0.2 µm filter.

The performance of the anti-reflective coating formulation was evaluated using AZ® EXP AX1120P photoresist (available from AZ® Electronic Materials, Clariant Corporation, Somerville, N.J.). An antireflective film from the above solution was coated on a silicon wafer and baked at 200° C. for 60 seconds. The antireflective film was found to have (n) value of 1.61 and (k) value of 0.49. Using AZ® EXP AX1120P photoresist a 330 nm film was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves, thus indicating the efficacy of the bottom anti-reflective coating.

Lithographic Evaluation Example 4

An comparative formulation 1A was made by dissolving 3 g polyester polymer (a reaction product of pyromellitic dianhydride, ethylene glycol and propylene oxide-as taught in US2004-0101779), 0.75 g of tetrakis (methoxymethyl)glycoluril (MX-270 available from Sanwa Chemicals, Japan), 0.03 g triethylammonium salts of dodecylsulfonic acid in 89.6 g PGMEA/PGME 70:30 mixture and 4.62 g 2-heptanone and 1.98 g of PGME. The solution was filtered through 0.2 µm filter.

A formulation 1B was made by dissolving 3 g polyester polymer from comparative formulation 1A, 7.36 g of the solution from Synthesis Example 7, 0.015 g triethylammonium salts of dodecylsulfonic acid in 89.6 g PGMEA/PGME 70:30 mixture. The solution was filtered through 0.2 µm filter.

The lithographic performance of the anti-reflective coating formulation was evaluated using AZ® EXP T8238 photoresist (product of AZ Electronic Materials USA Corp., Somerville, N.J.). About 80 nm thick film was coated and baked at 200° C. for 90 seconds on separate 8-inch silicon wafers with the anti-reflective coating formulations of this Example. Then a 210 nm thick AZ® EXP T8238 photoresist solution was coated and baked at 140° C. for 60 seconds. The wafer was then imagewise exposed using a Nikon 306D ArF scanner, 0.85 sigma under dipole illumination with Half-tone Phase Shift Mask. The exposed wafer was baked at 130° C. for 60 seconds and developed using a 2.38 wt % aqueous solution of tetramethyl ammonium hydroxide for 30 seconds. The performance of the antireflective coating, the collapse energy margin, was assessed by measuring the extra exposure energy required from the nominal process for a given photoresist feature before the photoresist image collapsed. In this example the 75 nm 1:1 feature size of photoresist on antireflective coating of formulation 1A and 1B were compared, and the results showed similar open and collapse energy values. This indicated that both the formulations gave good adherence to the antireflective coating. Thus the performance of the polymeric crosslinker of this Example is equivalent to the commercial monomeric crosslinker.

Lithographic Evaluation Example 5

A comparative anti-reflective coating formulation 2A was made by dissolving 0.7 g poly(hydroxystyrene-co-methyl methacrylate), 0.175 g of tetrakis (methoxymethyl)glycoluril (MX-270 available from Sanwa Chemicals, Japan), and 0.007 g triethylammonium salts of dodecylsulfonic acid in 49.3 g PGMEA/PGME 70:30 mixture. The solution was filtered through 0.2 µm filter.

An anti-reflective coating formulation 2B was made by dissolving 0.7 g poly(hydroxystyrene-co-methyl methacrylate), 0.250 g of crosslinker from Synthesis Example 9, and 0.007 g triethylammonium salts of dodecylsulfonic acid in 49.3 g PGMEA/PGME 70:30 mixture. The solution was filtered through 0.2 µm filter.

The performance of the anti-reflective coating formulations was evaluated using AZ® EXP T83720 photoresist (product of AZ Electronic Materials USA Corp., Somerville, N.J.). About 37 nm thick film was coated and baked at 200° C. for 90 seconds on separate 8-inch silicon wafers with the anti-reflective coating formulations of this Example. Then a 190 nm thick AZ® EXP T83720 photoresist solution was coated and baked at 115° C. for 60 seconds. The wafers were then imagewise exposed using a Nikon 306D ArF scanner, 0.85 sigma under dipole illumination with Half-tone Phase Shift Mask. The exposed wafers were baked at 110° C. for 60 seconds and developed using a 2.38 wt % aqueous solution of tetramethyl ammonium hydroxide for 30 seconds. The collapse energy margin was measured as in Lithographic Example 4. The 75 nm 1:1 feature size of photoresist on anti-reflective coating of formulation 2A and 2B were compared, and the results showed similar open and collapse energy values. Thus the performance of the polymeric crosslinker of this Example is equivalent to the commercial monomeric crosslinker.

Lithographic Evaluation Example 6

An antireflective coating composition was prepared by dissolving 1.0 g of the polymer prepared in Synthesis Example 10 and 0.01 g of triethylammonium salt of 10-camphorsulfonic acid in 49 g PGMEA/PGME. The solution was filtered through 0.2 µm filter.

The performance of the anti-reflective coating formulation was evaluated using AZ® EXP AX1120P photoresist (available from AZ Electronic Materials Corp. USA). An antireflective film from the above solution was coated on a silicon wafer and baked at 200° C. for 60 seconds. The antireflective film was found to have (n) value of 1.70 and (k) value of 0.30. Using AZ® EXP AX1120P photoresist a 330 nm film was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves, thus indicating the efficacy of the bottom anti-reflective coating.

Lithographic Evaluation Example 7

An antireflective coating composition was prepared by dissolving 1.0 g of the polymer prepared in Synthesis Example 13 and 0.01 g of triethylammonium salt of 10-camphorsulfonic acid in 49 g PGMEA/PGME. The solution was filtered through 0.2 µm filter.

The performance of the anti-reflective coating formulation was evaluated using AZ® EXP AX1120P photoresist (available from AZ Electronic Materials Corp. USA). An antireflective film from the above solution was coated on a silicon wafer and baked at 200° C. for 60 seconds. The antireflective film was found to have (n) value of 1.66 and (k) value of 0.41. Using AZ® EXP AX1120P photoresist a 330 nm film was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves, thus indicating the efficacy of the bottom anti-reflective coating.

The invention claimed is:

1. A coating solution comprising an organic solvent composition and a polymer, where the polymer is a reaction product of at least one glycoluril compound with at least one reactive compound containing at least one hydroxy group and/or at least one acid group, and further where the polymer is soluble in the organic solvent composition.

2. The coating composition according to claim 1, where the reactive compound contains 2 or more hydroxy or acid groups.

3. The coating composition according to claim 1, where the reactive compound contains a hydroxy group and/or an acid group.

4. The coating composition according to claim 1, where the reactive compound is a mixture selected from a reactive compound containing 2 or more hydroxy or acid groups and a reactive compound containing a hydroxy group and/or an acid group.

5. The coating according to claim 1, where the polymer further comprises a chromophore group.

6. The coating solution according to claim 1 where the organic solvent is selected from propylene glycol monomethyl ether acetate, propylene gycol monomethyl ether, ethyl lactate, 2-heptanone, cyclopentanone, cyclohexanone, gamma butyrolactone and mixtures thereof.

7. The coating according to claim 1, where the polymer has a weight average molecular weight greater than 1,000.

8. The coating solution according to claim 1, where the polymer comprises at least one unit of the structure

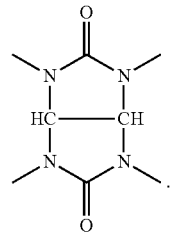

9. The coating solution according to claim 5, where the chromophore group absorbs radiation in the range 450 nm to 140 nm.

10. The coating solution according to claim 1, where the reactive compound is selected from ethylene glycol, diethylene glycol, propylene glycol, neopentyl glycol, polyethylene glycol, hexane dial, butane dial, styrene glycol, polypropylene oxide, polyethylene oxide, butylenes oxide, 1-phenyl-1,2-ethanediol, 2-bromo-2-nitro-1,3-propane diol, 2-methyl-2-nitro-1,3-propanediol, diethylbis(hydroxymethyl)malonate, hydroquinone, and 3,6-dithia-1,8-octanediol, Bisphenol A, 2,6-bis(hydroxymethyl)-p-cresol and 2,2'-(1,2-phenylenedioxy)-diethanol, 1,4-benzenedimethanol phenylsuccinic acid, benzylmalonic acid, 3-phenylglutaric acid 1,4-phenyldiacetic acid, oxalic acid, malonic acid, succinic acid, pyromellitic dianhydride, 3,3',4,4'-benzophenone-tetracarboxylic dianhydride, naphthalene dianhydride, 2,3,6,7-naphthalenetetracarboxylic acid dianhydride, 1,4,5,6-naphthalenetetracarboxylic acid dianhydride, 3-hydroxyphenylacetic acid, 2-(4-hydroxyphenoxy)propionic acid phenol, o-cresol, 2-ethoxyphenol, p-methoxyphenol, m-cresol, 4-ethylphenol, 4-propylphenol, 4-fluorophenol, 2,3-dimethoxyphenol, 2,6-dimethylphenol, 2,4-dimethylphenol, 3,4,5-trimethylphenol, 1-naphthol, 2-naphthol, 4-methoxy-1-naphthol, 2-phenylphenol, 4-(benzyloxy)phenol, benzyl alcohol, 2-methylbenzyl alcohol, 2-methoxybenzyl alcohol, 3-methylbenzyl alcohol, 3-(trifluromethyl)benzyl alcohol, 4-ethyl benzyl alcohol, 4-ethoxybenzyl alcohol, 4-(trifluoromethoxy)benzyl, 3,5-difluorobenzyl alcohol, 2,4,5-trimethoxybenzyl alcohol, 4-benzyloxybenzyl alcohol, 1-naphthalenethanol, 2-phenyl-1-propanol, 2,2-diphenylethanol, 4-phenyl-1-butanol, 2-phenoxyethanol, 4-methoxyphenethyl alcohol, 2-hydroxybenzophenone, phenylacetic acid, 1-naphthylacetic acid, and mixtures thereof.

11. The coating solution according to claim 1, where the glycoluril compound is selected from tetramethylol glycoluril, tetrabutoxymethyl glycoluril, tetramethoxymethyl glycoluril, partially methoylated glycoluril, tetramethoxymethyl glycoluril, dimethoxymethyl glycoluril, mono- and dimethylether of dimethylol glycoluril, trimethylether of tetramethylol glycoluril, tetramethylether of tetramethylol glycoluril, tetrakisethoxymethyl glycoluril, tetrakispropoxymethyl glycoluril, tetrakisbutoxymethyl glycoluril, tetrakisamyloxymethyl glycoluril, tetrakishexoxymethyl glycoluril, and mixtures thereof.

12. The coating solution according to claim 5, where the chromophore group is selected from an aromatic group and heteroaromatic group.

13. The coating solution according to claim 12, where the chromophore group is selected from a phenyl group, a substituted phenyl group, a naphthyl group, a substituted naphthyl group, an anthracyl group and a substituted anthracyl group.

14. The coating solution according to claim 1, further comprising an acid or an acid generator.

15. The coating solution according to claim 1 further comprising a thermal acid generator.

16. The coating solution according to claim 1, further comprising a secondary polymer.

17. The coating solution according to claim 16, where the secondary polymer has a chromophore group.

18. The coating solution according to claim 16, where the secondary polymer has a crosslinking group.

19. The coating solution according to claim 1, where the polymer is a crosslinking compound and further comprises at least one other crosslinkable polymer.

20. The coating solution according to claim 19, where the crosslinkable polymer comprises at least one group selected from an acid group, an ester group, a hydroxy group, an urethane group and an epoxy group.

21. The coating solution according to claim 19, where the solution further comprises a thermal acid generator.

22. A process for forming an image comprising,
a) coating and baking a substrate with a coating comprising an organic solvent composition and a polymer, where the polymer is a reaction product of at least one glycoluril compound with at least one reactive compound containing at least one hydroxy group and/or at least one acid group, and further where the polymer is soluble in the organic solvent composition;
b) coating and baking a photoresist film on top of the antireflective coating;
c) imagewise exposing the photoresist;
d) developing an image in the photoresist;
e) optionally, baking the substrate after the exposing step.

23. The process of claim 22, where the photoresist is imagewise exposed at wavelengths between 140 nm to 450 nm.

24. The process of claim 22, where the photoresist comprises a polymer and a photoactive compound.

25. The process of claim 22, where the antireflective coating is baked at temperatures greater than 90° C.

26. A polymer, where the polymer is a reaction product of at least one glycoluril compound with at least one reactive compound containing at least one hydroxy group and/or at least one acid group, and further where the polymer is soluble in an organic solvent.

27. The coating solution according to claim 1, where the glycoluril compound has the structure,

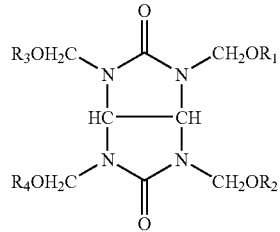

where $R_1$, $R_2$, $R_3$, and $R_4$ are independently H or $(C_1\text{-}C_{10})$ alkyl.

* * * * *